United States Patent
Park

(10) Patent No.: US 8,658,884 B2
(45) Date of Patent: Feb. 25, 2014

(54) SOLAR CELL INCLUDING BACKSIDE REFLECTION LAYER COMPOSED OF HIGH-K DIELECTRICS

(75) Inventor: Hyunjung Park, Seoul (KR)

(73) Assignee: LG Electronics Inc., Seoul (KR)

( * ) Notice: Subject to any disclaimer, the term of this patent is extended or adjusted under 35 U.S.C. 154(b) by 872 days.

(21) Appl. No.: 12/530,603

(22) PCT Filed: Mar. 18, 2008

(86) PCT No.: PCT/KR2008/001511
§ 371 (c)(1),
(2), (4) Date: Sep. 9, 2009

(87) PCT Pub. No.: WO2008/117951
PCT Pub. Date: Oct. 2, 2008

(65) Prior Publication Data
US 2010/0096013 A1    Apr. 22, 2010

(30) Foreign Application Priority Data
Mar. 23, 2007 (KR) .................. 10-2007-0028845

(51) Int. Cl.
*H01L 31/042* (2006.01)
*H01L 31/0232* (2006.01)
*H01L 31/0216* (2006.01)

(52) U.S. Cl.
CPC ...... *H01L 31/02327* (2013.01); *H01L 31/0216* (2013.01); *Y02E 10/545* (2013.01); *Y02E 10/546* (2013.01); *Y02E 10/547* (2013.01)
USPC .......................... 136/246; 136/256

(58) Field of Classification Search
CPC ............ H01L 31/02327; Y02E 10/545; Y02E 10/546; Y02E 10/547
USPC .................................. 136/256, 246
See application file for complete search history.

(56) References Cited

U.S. PATENT DOCUMENTS 3,988,167 A   10/1976   Kressel et al.
4,347,263 A   8/1982   Whitehouse
(Continued)

FOREIGN PATENT DOCUMENTS

DE        3815512 A1   11/1989
EP        0 735 597 A2   10/1996
(Continued)

OTHER PUBLICATIONS

Callegari, "Physical and electrical characterization of Hafnium oxide and Hafnium silicate sputtered films", Journal of Applied Physics, vol. 90. No. 12, pp. 6466-6475, Dec. 15, 2001.*

(Continued)

*Primary Examiner* — Devina Pillay
(74) *Attorney, Agent, or Firm* — Birch, Stewart, Kolasch & Birch, LLP

(57) ABSTRACT

A solar cell includes a backside reflection layer containing a high-k dielectrics. The backside reflection layer includes a reflection film containing $HfO_2$ or $ZrO_2$ and a backside passivation layer containing of $HfSi_xO_y$, $ZrSi_xO_y$ or $SiO_2$, which are formed on a rear side of a substrate onto which solar rays are input. Thus, the solar cell exhibits excellent optical trapping for solar rays and low recombination rate of carriers on the rear side. Also, since the reflection film and the backside passivation layer have excellent thermal stability, it is possible to form electrodes by applying various processes such as thermal treatment.

15 Claims, 2 Drawing Sheets

(56) References Cited

U.S. PATENT DOCUMENTS

| | | | |
|---|---|---|---|
| 4,865,999 | A | 9/1989 | Xi et al. |
| 4,994,879 | A | 2/1991 | Hayashi |
| 5,720,827 | A | 2/1998 | Simmons |
| 5,907,766 | A * | 5/1999 | Swanson et al. ............ 438/72 |
| 6,563,141 | B1 * | 5/2003 | Dawson et al. ............ 257/98 |
| 6,692,985 | B2 | 2/2004 | Huang et al. |
| 6,846,984 | B2 | 1/2005 | Fath et al. |
| 2002/0185171 | A1 | 12/2002 | Huang et al. |
| 2004/0112426 | A1 * | 6/2004 | Hagino ............ 136/256 |
| 2005/0287479 | A1 * | 12/2005 | Moon ............ 430/330 |
| 2007/0137699 | A1 * | 6/2007 | Manivannan et al. ....... 136/261 |
| 2010/0059114 | A1 | 3/2010 | Park et al. |

FOREIGN PATENT DOCUMENTS

| | | |
|---|---|---|
| EP | 1 489 667 A2 | 12/2004 |
| EP | 1 635 398 A2 | 3/2006 |
| EP | 1 772 419 A1 | 11/2006 |
| KR | 10-2005-0087248 A | 8/2005 |
| KR | 10-2008-0020351 A | 3/2008 |
| KR | 10-2008-0054807 A | 6/2008 |

OTHER PUBLICATIONS

Liu, "Hf1—$x$Si$x$O$y$ dielectric films deposited by UV photo-induced chemical vapour deposition (UV-CVD)", Applied Surface Science, vol. 253, pp. 7869-7873, Feb. 2007.*

* cited by examiner

SOLAR CELL INCLUDING BACKSIDE REFLECTION LAYER COMPOSED OF HIGH-K DIELECTRICS

TECHNICAL FIELD

The present invention relates to a solar cell, and more particularly to a solar cell capable of decreasing recombination of a backside of a carrier with ensuring excellent optical trapping for solar rays.

BACKGROUND ART

Recently, as exhaustion of existing energy resources such as petroleum and coal is estimated, interests on alternative energies for substituting them are more increased. Among the alternative energies, a solar cell is particularly spotlighted since its energy resource is sufficient and it does not cause any environmental pollution. A solar cell is classified into a solar heat cell that generates a vapor required for rotating a turbine using a solar heat, and a solar light cell that converts photons into electric energy using the properties of a semiconductor. Generally, a solar cell calls the solar light cell (hereinafter, the term 'solar cell' is used).

Referring to FIG. 1 showing a basic structure of a solar cell, the solar cell has a junction structure of a p-type semiconductor 101 and a n-type semiconductor 102 like a diode. If photons are input to the solar cell, the photons are reacted with materials of the semiconductor to generate electrons of (−) charge and holes of (+) charge caused by removal of the electrons, thereby allowing flow of electric current as they are moving. It is called photovoltaic effect. Among the p-type semiconductor 101 and the n-type semiconductor 102 that composes the solar cell, electrons are drawn toward the n-type semiconductor 102 and the holes are drawn toward the p-type semiconductor 101, so they are moved to electrodes 103, 104 joined to the n-type semiconductor 101 and the p-type semiconductor 102, respectively. If the electrodes 103, 104 are connected using a cable, it is possible to obtain an electric power as electricity flows.

In addition to the above basic structure of a solar cell, an anti-reflection layer and a reflection layer are respectively provided to front and rear sides of the solar cell in order to enhance the efficiency of the solar cell. The anti-reflection layer and the reflection layer respectively prevent reflection of solar rays inputting onto the front side and also reflect solar rays passing through the rear side of the solar cell, thereby enhancing optical trapping.

The reflection layer should have a high reflectivity for solar rays and also ensure low recombination of carriers on an interface between the reflector layer and a semi-conductor layer. However, a conventional reflection layer does not have excellent reflectivity and sufficient prevention of recombination of carriers. In addition, due to bad thermal stability, the conventional reflection layer has a limit in increasing a temperature of a thermal treatment process used for forming a rear electrode.

DISCLOSURE OF INVENTION

Technical Problem

The present invention is designed to solve the problems of the prior art, and therefore it is an object of the present invention to provide a solar cell capable of decreasing recombination of a backside of a carrier with ensuring excellent optical trapping for solar rays.

Technical Solution

In order to accomplish the above object, the present invention provides a solar cell, which includes a p-n junction structure having a first conductive silicon layer, a second conductive silicon layer positioned on the first conductive silicon layer and having a conduction opposite to the first conductive silicon layer, and a p-n junction formed at an interface between the first conductive silicon layer and the second conductive silicon layer; an anti-reflection layer formed on the second conductive silicon layer; a backside reflection layer positioned on the first conductive silicon layer and having a backside passivation layer containing HfSixOy, ZrSixOy or $SiO_2$ and a reflection film containing $HfO_2$ or $ZrO_2$; a front electrode connected to the second conductive silicon layer through the anti-reflection layer; and a rear electrode connected to the first conductive silicon layer through the reflection film and the backside passivation layer.

The backside reflection layer may be formed by depositing $HfO_{2-x}$ or $ZrO_{2-x}$ onto the first conductive silicon layer and then executing a post thermal $O_2$ annealing process thereto. Also, the $HfO_{2-x}$ or $ZrO_{2-x}$ may be deposited onto the first conductive silicon layer by means of CVD (Chemical Vapor Deposition) or PECVD (Plasma Enhanced Chemical Vapor Deposition). Preferably, the post thermal $O_2$ annealing process is executed by means of wet oxidation or rapid thermal oxidation.

BRIEF DESCRIPTION OF THE DRAWINGS

Other objects and aspects of the present invention will become apparent from the following description of embodiments with reference to the accompanying drawing in which.

BEST MODE FOR CARRYING OUT THE INVENTION

Hereinafter, preferred embodiments of the present invention will be described in detail with reference to the accompanying drawings.

Figure 1:
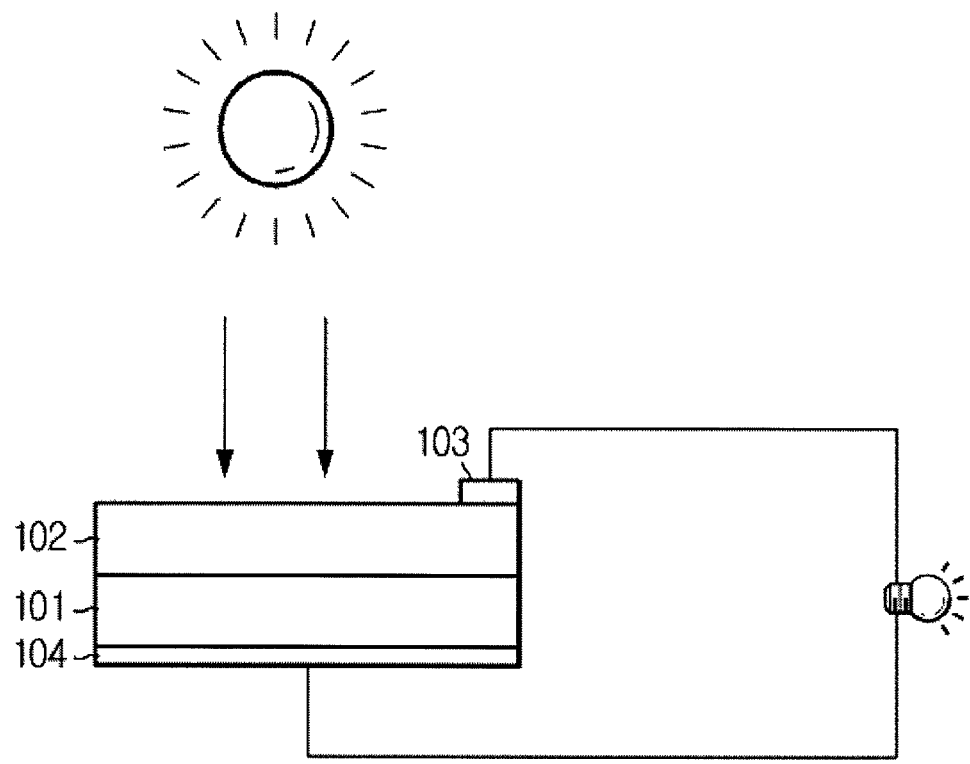
FIG. 1 is a schematic view showing a basic structure of a solar cell.
Figure 2:
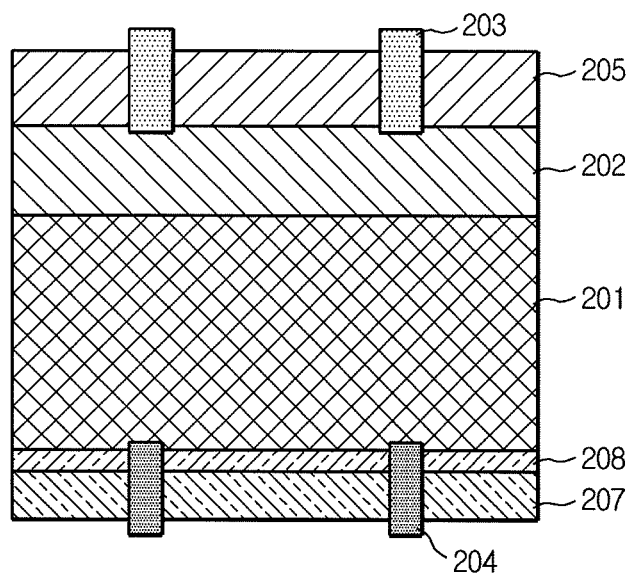
FIG. 2 is a schematic view showing a solar cell according to a first embodiment of the present invention.

FIG. 2 is a schematic view showing a solar cell according to a first embodiment of the present invention. As shown in FIG. 2, the solar cell according to the present invention includes a p-n junction structure, an anti-reflection layer 205, a front electrode 203, a rear electrode 204, a reflection film 207 and a backside passivation layer 208.

The p-n junction structure includes a first conductive silicon layer 201, a second conductive silicon layer 202 having a conduction opposite to the first conductive silicon layer 201, and a p-n junction formed at an interface between the first and second conductive silicon layers 201, 202. The p-n junction structure receives light to generate electric current by means of a photovoltaic effect. The p-n junction structure is made by forming, on the first conductive silicon layer, the second conductive silicon layer 202 with an opposite conduction and then forming a p-n junction at an interface of the first and second conductive silicon layers 201, 202. Representatively, the first conductive silicon layer is a p-type silicon layer doped with Group 3 element such as B, Ga and In, and the second conductive silicon layer 202 is a n-type emitter layer doped with Group 5 element such as P, As and Sb. The p-n junction is formed by joining the p-type silicon layer and the n-type emitter layer.

A backside reflection layer 207, 208 is provided to enhance optical trapping for solar rays, and it is composed of the reflection film 207 and the backside passivation layer 208. The reflection film 207 is used for reflecting solar rays such that the solar rays are not discharged through the solar cell, and the reflection film 207 has $HfO_2$ or $ZrO_2$. The backside passivation layer 208 is used for preventing recombination of carriers (electrons or pores) at a rear side, and the backside passivation layer 208 has HfSixOy, ZrSixOy or $SiO_2$.

$HfO_2$ and $ZrO_2$ respectively have a refractive index of 1.9 or less and 2.2 or less, which are greatly lower than a refractive index of 3.8 of silicon (Si). Thus, the reflection film 207 formed using them shows excellent reflectivity for solar cells, and HfSixOy, ZrSixOy and $SiO_2$ show excellent passivation characteristics. In addition, the reflection film 207 and the backside passivation layer 208 have very excellent thermal stability, and they are not decomposed even in an electrode forming process that requires high temperature such as thermal treatment (commonly, executed at about 800° C.). In more detail, $HfO_2/SiO_2$, $ZrO_2/SiO_2$ and $ZrO_2/ZrSixOy$ are respectively decomposed at 900 to 1000° C., 900° C. or above, and 880° C. or above. Thus, by configuring the reflection film 207 and the backside passivation layer 208 as mentioned above, it is possible to broaden the range of selections for an electrode forming process without being restricted to a process limit such as high temperature. In particular, if the rear electrode 204 is made by means of printing or thermal treatment, the rear electrode 204 may be made in a simple way at a lower process cost rather than a backside electrode forming method using laser. Thus, by configuring the backside reflection layer 207, 208 as mentioned above, it is possible to give additional effects such as simplified process and reduced production cost.

Figure 3:
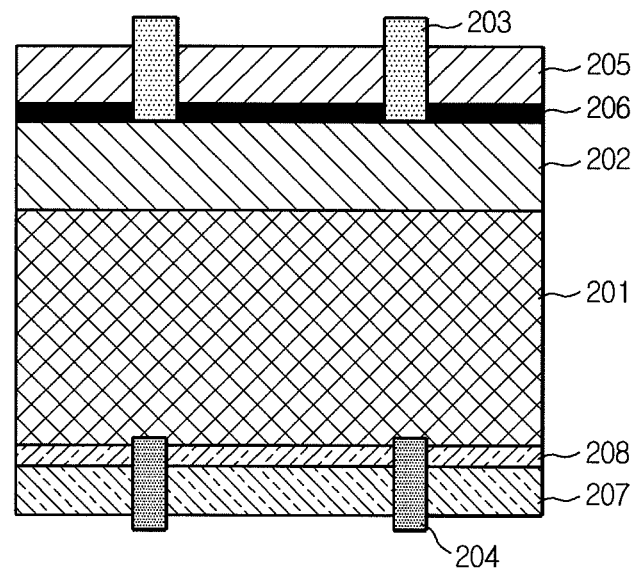
FIG. 3 is a schematic view showing a solar cell according to a second embodiment of the present invention.

The backside reflection layer 207, 208 may be formed by depositing $HfO_{2-x}$ or $ZrO_{2-x}$ onto the first conductive silicon layer and then executing a post thermal $O_2$ annealing process thereto. Here, $HfO_{2-x}$ or $ZrO_{2-x}$ may be deposited onto the first conductive silicon layer by means of CVD (Chemical Vapor Deposition) or PECVD (Plasma Enhanced Chemical Vapor Deposition). The post thermal $O_2$ annealing process is executed under an oxygen circumstance. By executing the post thermal $O_2$ annealing process, the backside passivation layer 208 having HfSixOy, ZrSixOy or $SiO_2$ is formed at the interface between the first conductive silicon layer 201 and $HfO_{2-x}$ or $ZrO_{2-x}$, and the $HfO_{2-x}$ or $ZrO_{2-x}$ is converted into $HfO_2$ or $ZrO_2$ to form the reflection film 207. The post thermal $O_2$ annealing process may be executed by means of wet oxidation or rapid thermal oxidation. In the former case, a $SiO_2$ layer 206 is formed on the second conductive silicon layer 202 as shown in FIG. 3, so it may be used as a front-side passivation layer. In the latter case, a $SiO_2$ layer is not formed.

The anti-reflection layer 205 is formed on the second conductive silicon layer to minimize a reflectivity for solar rays such that optical trapping for solar rays inputting to the solar cell may be enhanced. The anti-reflection layer 205 may be made of any well-known material usable for forming conventional anti-reflection layers, unlimitedly, among which silicon nitride is the most representative one. Also, the anti-reflection layer may be made by means of CVD (Chemical Vapor Deposition), PECVD (Plasma Enhanced Chemical Vapor Deposition) or sputtering.

As shown in FIG. 3, a front-side passivation layer 206 may be further formed between the anti-reflection layer 205 and the second conductive silicon layer 202 to prevent recombination of carriers. The front-side passivation layer 206 representatively employs $SiO_2$. As explained above, in case the backside reflection layer 207, 208 is formed by means of wet oxidation, the $SiO_2$ layer 206 is formed as a front-side passivation layer on the second conductive silicon layer 202, and the anti-reflection layer 205 is formed on the $SiO_2$ layer 206.

The front electrode 203 is connected to the second conductive silicon layer 202 through the anti-reflection layer 205, and the rear electrode 204 is connected to the first conductive silicon layer 201 through the reflection film 207 and the backside passivation layer 208. If loads are applied to these electrodes 203, 204, electricity generated in the solar cell can be utilized. The front electrode 203 representatively employs a silver electrode since the silver electrode has an excellent electric conductivity. Also, the rear electrode 204 representatively employs an aluminum electrode since the aluminum electrode has an excellent conductivity and allows well junction due to good affinity with silicon. In addition, the aluminum electrode corresponds to Group 3 element, which forms a p+ layer, namely BSF (Back Surface Field), at a contact surface with the silicon substrate such that carriers do not disappear but gather, thereby enhancing efficiency of the solar cell.

The front electrode 203 may be representatively formed by coating an electrode-forming paste containing silver and glass frit onto an anti-reflection layer according to a predetermined pattern and then thermally treating the electrode-forming paste. By means of the thermal treatment, the front electrode 203 pierces the anti-reflection layer 205 and connects to the second conductive silicon layer 202. The rear electrode is formed by ensuring a space that allows a rear electrode to connect with the first conductive silicon layer 201 by means of photolithography or laser and then forming a rear electrode in the space. At this time, the rear electrode may be formed in various ways, but the backside reflection layer 207, 208 as explained above may be formed by applying an electrode forming method using high temperature thermal treatment since the backside reflection layer has an excellent thermal stability. That is to say, it is possible to form a rear electrode by printing an electrode-forming paste containing aluminum and then thermally treating the electrode-forming paste. The front electrode 203 and the rear electrode 204 may be formed in a reverse order, and the thermal treatment for the front and rear electrodes may be executed at the same time.

It should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

INDUSTRIAL APPLICABILITY

The solar cell according to the present invention includes a reflection film containing $HfO_2$ or $ZrO_2$ and a backside passivation layer containing of HfSixOy, ZrSixOy or $SiO_2$, so the solar cell exhibits excellent optical trapping and low recombination rate of carriers on the rear side. In addition, since the reflection film and the backside passivation layer have excellent thermal stability, it is possible to form electrodes by applying various processes such as thermal treatment.

The invention claimed is:

1. A solar cell comprising:
   a p-n junction structure having a first conductive silicon substrate, a second conductive silicon substrate positioned on a front side of the first conductive silicon substrate and having a conduction opposite to the first conductive silicon substrate, and a p-n junction formed at an interface between the first conductive silicon substrate and the second conductive silicon substrate;
   an anti-reflection layer formed on a front side of the second conductive silicon substrate;
   a backside passivation layer positioned on a rear side of the first conductive silicon substrate and containing at least one of $HfSi_xO_y$, $ZrSi_xO_y$ and $SiO_2$;
   a reflection film positioned on the backside passivation layer and containing at least one of $HfO_2$ and $ZrO_2$;
   a front electrode connected to the second conductive silicon substrate through the anti-reflection layer; and
   a rear electrode connected to the first conductive silicon substrate through the reflection film and the backside passivation layer,
   wherein the reflection film is thicker than the backside passivation layer.

2. The solar cell according to claim 1,
   wherein the backside passivation layer and the reflection film are formed by depositing $HfO_{2-x}$ or $ZrO_{2-x}$ onto the first conductive silicon substrate and then executing a post thermal $O_2$ annealing process thereto.

3. The solar cell according to claim 2,
   wherein the $HfO_{2-x}$ or $ZrO_{2-x}$ is deposited onto the first conductive silicon substrate by means of CVD (Chemical Vapor Deposition) or PECVD (Plasma Enhanced Chemical Vapor Deposition).

4. The solar cell according to claim 2,
   wherein the post thermal $O_2$ annealing process is executed by means of wet oxidation.

5. The solar cell according to claim 2,
   wherein the post thermal $O_2$ annealing process is executed by means of rapid thermal oxidation.

6. The solar cell according to claim 1,
   wherein the first conductive silicon substrate is a p-type silicon substrate, and the second conductive silicon substrate is a n-type emitter layer.

7. The solar cell according to claim 1,
   wherein the anti-reflection layer includes silicon nitride.

8. The solar cell according to claim 7,
   wherein the anti-reflection layer is formed by PECVD, CVD or sputtering.

9. The solar cell according to claim 1,
   wherein the solar cell further comprises a front-side passivation layer between the anti-reflection layer and the second conductive silicon substrate.

10. The solar cell according to claim 1,
    wherein the front electrode includes silver.

11. The solar cell according to claim 1,
    wherein the rear electrode includes aluminum.

12. The solar cell according to claim 1, wherein the rear electrode is connected to the first conductive silicon substrate through a hole formed on the reflection film and the backside passivation layer.

13. The solar cell according to claim 12, wherein the hole of the reflection film and the backside passivation layer is formed by a laser or photolithography.

14. The solar cell according to claim 1, further comprising a back surface field (BSF) formed on a contact surface between the rear electrode and the first conductive type silicon substrate.

15. The solar cell according to claim 9, wherein the front-side passivation layer contains silicon oxide ($SiO_2$).

* * * * *